HIGH FREQUENCY TRANSISTOR WITH SLOPING EMITTER JUNCTION

Filed Nov. 30, 1965

United States Patent Office 3,428,873
Patented Feb. 18, 1969

3,428,873

HIGH FREQUENCY TRANSISTOR WITH SLOPING EMITTER JUNCTION

Winfried Meer and Hans Hargasser, Munich, Germany, assignors to Siemens Aktiengesellschaft, a corporation of Germany Filed Nov. 30, 1965, Ser. No. 510,720
Claims priority, application Germany, Dec. 1, 1964, S 94,397
U.S. Cl. 317—235 7 Claims
Int. Cl. H01l 5/02

ABSTRACT OF THE DISCLOSURE

Described is a semiconductor device comprising a semiconductor body having on one side a diffused base region and an emitter region alloyed into said base region to form an emitter p-n juction therewith, respective base and emitter electrodes at the surface of said body on said one side, and a collector region located near the opposite side of said body and forming a collector p-n junction with said base region. The zone of the base region intermediate the two junctions comprises at least one portion having a thickness continuously increasing in a direction parallel to the surface of a semiconductor body, and at least one other portion having a thickness continuously decreasing in said direction.

Our invention relates to semiconductor devices, such as transistors, of the type having a diffused base region and an alloyed emitter region, the two regions being contacted by respective electrodes which are both located on the same surface side of the semiconductor body.

It is the main object of the invention to improve the high-frequency qualities of such semiconductor devices, particularly transistors.

Another object of the invention is to afford increasing the dimensions of the semiconductor system while maintaining the same high-frequency (HF) quality.

Essential to the quality of HF transistors and other HF devices are particularly the charge-carrier transit times, capacitances and path resistances. To keep these magnitudes as small as possible, the geometric dimensions of transistor systems must be extremely small, which considerably aggravates their manufacture. Consequently, the object of affording an increase in dimension without detriment to HF qualities is tantamount to permitting a reduction in manufacturing cost.

To achieve these objects, and in accordance with a feature of our invention, inter-junction zone of the base region, this being the zone remaining between the emitter p-n junction and the collector p-n junction after the emitter is alloyed into the base region, is composed of at least one component portion whose thickness continuously increases in one direction parallel to the semiconductor surface, and of at least another component portion whose thickness continuously decreases parallel to the semiconductor surface in the same direction. The penetrating depth of the emitter p-n junction in a semiconductor device according to the invention, therefore, is different at different points along a direction parallel to the semiconductor surface into which the emitter is alloyed. Since the base region is produced by diffusion and consequently possesses a dopant-concentration gradient perpendicular to the surface of the semiconductor body, the inhomogeneous alloying depth of the emitter region parallel to the semiconductor surface has the result that different portions of the injecting emitter area are situated at localities of respectively different base doping. As a consequence, the injection along the injecting emitter area is inhomogeneous. In this manner, a favorable effect can be imposed upon those parameters of the semiconductor device that determine the high-frequency quality, such as transit times, capacitances and path resistances, for any given geometric dimensioning of the device. A semiconductor device according to the invention, therefore, exhibits an increased high-frequency quality without change in geometric dimensions, in comparison, for example, with a device having a uniformly in-alloyed emitter. On the other hand, an increase of the geometric dimensions is possible, thus reducing the manufacturing cost, while preserving given high-frequency qualities.

According to one way of embodying the invention, the emitter region is elongated so that it has a larger dimension parallel to the semiconductor surface in one direction than in a direction perpendicularly thereto, and the continuous increase or decrease in thickness of the interjunction zone of the base region is in the direction of the largest dimension of the emitter region.

According to an alternative feature of the invention, particularly well suitable for HF large-signal amplifying transistors, the continuous increase or decrease in thickness of the inter-junction base zone is in the direction of the smaller dimension of the emitter region, namely in such a manner that the thickness of the remaining base zone increases in the direction from the emitter to the base contact electrode.

The change in thickness of the intermediate base zone may be in accordance with the shape of a wedge, for example. However, a step-shaped alloying front and consequently a stepped emitter p-n junction may also be provided. According to one of the embodiments of the invention, the thickness of the base zone increases and decreases continuously in an immediate sequence.

For further elucidating, reference will be made to embodiments of transistors according to the invention illustrated by way of example on the accompanying drawings in which.

Figure 1:
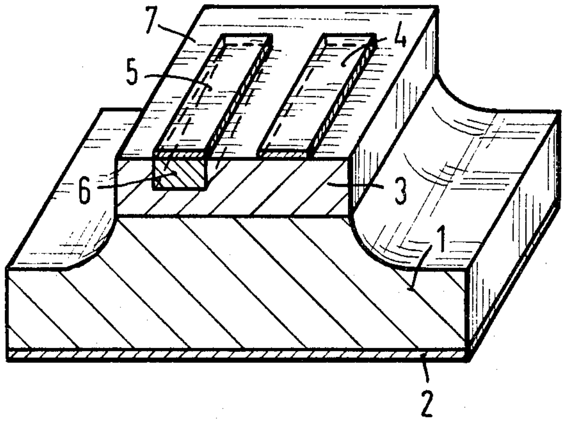
FIG. 1 is a schematic perspective illustration, partly in section, of a mesa transistor.

The transistor according to FIG. 1 has its collector region 1 provided with a collector electrode 2, the collector region having p-conductance, for example. The base region 3 forming the top portion of the mesa is produced by diffusion and carries a base electrode 4. Alloyed into the base region 3 is the emitter region 6, which carries an emitter electrode 5. After alloying of the emitter region, there remains a residual or intermediate base zone 13 between the emitter p-n junction 14 and the collector p-n junction 15 (FIG. 2).

Figure 2:
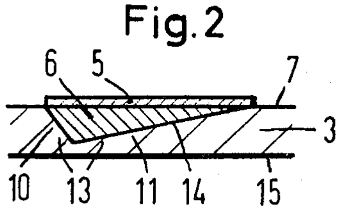
FIG. 2 shows a cross section through the base and emitter regions of the transistor shown in FIG. 1, the section standing perpendicularly to the plane of illustration.

As will be seen from the cross section shown in FIG. 2, the intermediate zone of the base region 3 has two portions 10 and 11 whose thickness continuously decreases and increases, respectively, in a direction parallel to the semiconductor surface. In this particular embodiment, the remaining intermediate base zone has the shape of a wedge. This is achieved by virtue of the fact that the emitter p-n junction in the base region likewise extends in the shape of a wedge relative to the direction parallel to the semi-conductor surface. The decrease in thickness of the remaining base zone corresponds to an increase in thickness of the emitter zone 6, and vice versa. Furthermore, in a first direction parallel to the semiconductor surface 7, namely in a direction which in FIG. 2 lies in the plane of illustration, the intermediate base zone has a larger dimension than in a second direction perpendicular to the first direction and consequently located in the plane of the cross section apparent from FIG. 1. The continuous increase or decrease in thickness of the base zone is in the first direction in which the elongated emitter region has its largest dimension.

Figures 3, 4:
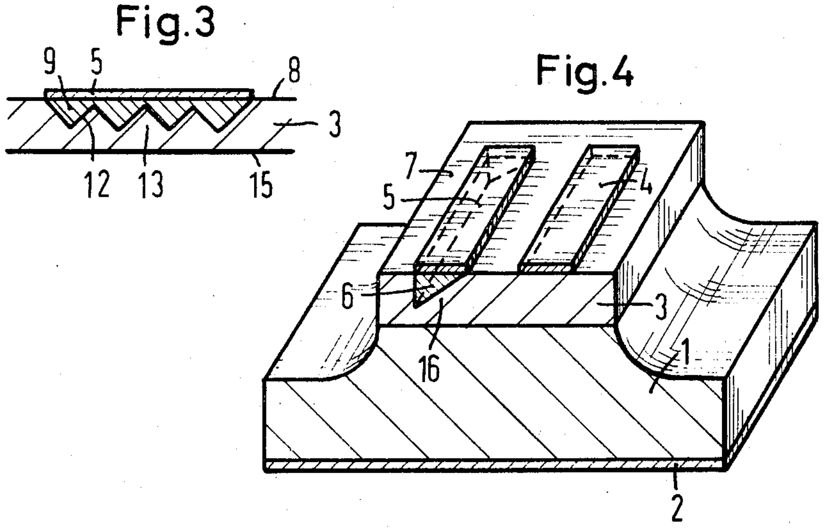
FIG. 3 shows a different embodiment of the base and emitter region in a section corresponding to that of FIG. 2.
FIG. 4 is a schematic and perspective view of a mesa transistor section.

The cross section of the modified embodiment illustrated in FIG. 2 is located in the same plane as the section shown in FIG. 2. In the embodiment of FIG. 3 the thickness of the remaining base zone repeatedly decreases and increases continuously in an intermediate sequence. Consequently, the emitter p-n junction 12 between emitter region 9 and base region 3 exhibits a zigzag configuration in this cross section.

In the mesa transistor shown in FIG. 4, the increase or decrease in thickness of the remaining base zone 16 lies in the direction of the smaller dimension of the elongated emitter region 6, in contrast to the embodiment of FIG. 1.

Preferably, a semiconductor device according to the invention is produced by alloying the emitter into a surface area which is inclined toward the 111-face of the semiconductor crystal. By selecting the inclination angle of the alloying surface relative to the 111-plane, the geometric shape of the remaining base region and consequently the thickness contour parallel to the semiconductor surface can be adjusted as may be desired. Thus, an inclination of 1.5 to 2° relative to the 111-plane results in a wedge-shaped contour as shown in FIGS. 1 and 2. The inclination of the 111-plane in this case is in the direction of the emitter longitudinal axis, which is the direction of its largest dimension parallel to the semiconductor surface.

With an inclination angle larger than 4° but smaller than the angle formed between the 111-plane and the 110-plane or 100-plane, a step-shaped alloying front at the emitter is obtained, such as the one illustrated in FIG. 3. In order to make certain that the continuous increase or decrease in thickness of the remaining base zone is in the direction of the largest emitter-region dimension, care must again be taken that the inclination of the 111-plane is in the direction of the larger emitter-region dimension and consequently in the direction of the longitudinal axis of the emitter region.

Described in the following are two particularly favorable embodiments of the method for producing semiconductor devices according to the invention.

Used as starting material in the first example are slices of monocrystalline p-type germanium having a conductivity of a few mohm·cm. The polished surface of the slice is 1.5 to 2° inclined toward the 111-plane. The inclination direction of the 111-plane is to be indicated by a suitable marking on the slice. The polished and subsequently etched surface of the slice is subjected to epitaxial precipitation of germanium. In this manner, a high-ohmic, p-type germanium layer of more than 20$\mu$ is deposited having a specific resistance of 5 to 10 ohm·cm. This layer sequence of a relatively low-ohmic and a relatively high-ohmic zone is to later constitute the collector region in the finished transistor. Thereafter, an n-type layer of 1.4 to 1.7$\mu$ depth and a layer resistance of 50 to 60 ohm per unit area is diffused into the high-ohmic epitaxial layer. This in-diffused n-type layer serves to form the base region of the transistor. Aluminum spots of 27 x 70$\mu$ and a layer thickness of 3000 A. are vapor-deposited in high vacuum at 380° C. upon the diffusion layer and are thereafter alloyed into the diffusion layer at a temperature of 520° C. maintained for two seconds. The vapor-deposited layer may also consist of a mixture of 70% aluminum and 30% gold. The vapor deposition is effected in such a manner that the longitudinal direction of the vapor-deposited spots is in the direction of the departure from the correct orientation. The vapor deposition of the electrode spots is effected conventionally with the use of masks. After displacing the masks, a base contact is vapor-deposited at a distance of 10$\mu$ from the emitter spot. The further fabricating steps for producing the transistors are in accordance with the conventional methods.

In a second example of the method, the starting material was a monocrystalline p-type germanium wafer whose top surface was inclined more than 4° relative to the 111-plane. However, the angle of inclination was smaller than the inclination of the 111-plane relative to the 110- or 100-plane. A high-ohmic epitaxial layer was precipitated upon this surface in the manner described above with reference to the first example. Thereafter, an n-type base layer, an emitter contact and a base contact were deposited, also as described above. The departure of the surface of more than 4° from the 111-plane resulted in producing a step-shaped alloying front at the emitter. The formation of the base remaining region thus corresponded, for example, to the one represented in FIG. 3, whereas the first-described embodiment leads to a wedge-shaped base zone of the type illustrated in FIGS. 1 and 2.

The term plano is used in this application to define a substantially planar surface in contradistinction to an arcuate surface.

We claim:

1. In a semiconductor device comprising a semiconductor body having on one side a base region and an emitter region in said base region forming an emitter p-n junction therewith, respective base and emitter electrodes at the surface of said body on said one side, and a collector region on the opposite side of said body forming a collector p-n junction with said base region, the improvement according to which the emitter p-n junction comprises at least two plano-portions each having an edge terminating on the surface of the base on said one side of the semiconductor body, and each plano-portion disposed in a sloping relation with said collector p-n junction, and said portions intersecting in an inverted apex forming the nearest part of said emitter junction to said collector junction.

2. In a semiconductor device as set forth in claim 1, said emitter region having parallel to said surface in one direction a larger dimension than in the direction perpendicularly thereto, and said increase and decrease in thickness of said intermediate base zone being in the direction of said larger dimension of said emitter region.

3. In a semiconductor device as set forth in claim 1, said emitter region having parallel to said surface in one direction a larger dimension than in the direction perpendicularly thereto, and said increase and decrease in thickness of said intermediate base zone being in said perpendicular direction.

4. In a semiconductor device as set forth in claim 3, said intermediate base zone increasing in the direction from said emitter electrode toward said base electrode.

5. In a semiconductor device as set forth in claim 1, said remaining base region being wedge-shaped.

6. In a semiconductor device as set forth in claim 1, said interemdiate base zone having a stepped thickness contour.

7. In a semiconductor device as set forth in claim 6, said intermediate base thickness increasing and decreasing repeatedly in directly alternating succession along said direction.

References Cited

UNITED STATES PATENTS

| | | | |
|---|---|---|---|
| 2,666,814 | 1/1954 | Shackley | 317—235 |
| 2,728,881 | 12/1955 | Jacobi | 317—235 |
| 2,869,055 | 1/1959 | Nayce | 317—235 |
| 3,087,100 | 4/1963 | Savadeles | 317—235 |
| 3,114,664 | 12/1963 | Yoshida | 317—235 |
| 3,202,887 | 8/1965 | Dacey et al. | 317—235 |
| 3,304,595 | 2/1967 | Sato et al. | 317—235 |
| 3,323,028 | 5/1967 | Froschle | 317—235 |

JAMES D. KALLAM, *Primary Examiner.*

U.S. Cl. X.R.

29—569; 317—234